(12) United States Patent
Zheng

(10) Patent No.: US 10,469,090 B1
(45) Date of Patent: Nov. 5, 2019

(54) INVERTER-BASED FILTER BIASING WITH RING OSCILLATOR-BASED SUPPLY REGULATION

(71) Applicant: Xilinx, Inc., San Jose, CA (US)

(72) Inventor: Kevin Zheng, San Jose, CA (US)

(73) Assignee: XILINX, INC., San Jose, CA (US)

(*) Notice: Subject to any disclaimer, the term of this patent is extended or adjusted under 35 U.S.C. 154(b) by 200 days.

(21) Appl. No.: 15/441,052

(22) Filed: Feb. 23, 2017

(51) Int. Cl.
H03L 7/08 (2006.01)
H03K 3/03 (2006.01)
H03L 7/099 (2006.01)
H03H 11/04 (2006.01)

(52) U.S. Cl.
CPC ....... *H03L 7/0805* (2013.01); *H03H 11/0472* (2013.01); *H03K 3/0315* (2013.01); *H03L 7/0995* (2013.01); *H03H 2210/021* (2013.01); *H03H 2210/04* (2013.01)

(58) Field of Classification Search
CPC ....... H03L 7/0805; H03L 7/02; H03L 7/0995; H03H 11/0422; H03H 11/0427; H03H 11/0472; H03H 2210/023; H03H 2210/04; H03K 3/0315
See application file for complete search history.

(56) References Cited

U.S. PATENT DOCUMENTS

| | | |
|---|---|---|
| 5,410,189 A | 4/1995 | Nguyen |
| 6,034,557 A | 3/2000 | Schultz et al. |
| 6,262,609 B1 * | 7/2001 | Hafez ............ H03L 7/02 327/101 |
| 6,628,151 B1 | 9/2003 | Zhou et al. |
| 7,129,763 B1 * | 10/2006 | Bennett .......... G06F 1/3203 327/262 |
| 7,248,103 B2 * | 7/2007 | Marais ........... H03H 11/04 327/553 |
| 7,525,362 B1 | 4/2009 | Lesea et al. |
| 2002/0149087 A1 * | 10/2002 | Okada .......... H03H 11/265 257/533 |
| 2007/0115070 A1 * | 5/2007 | Tu ............ H03H 11/0433 331/36 C |

OTHER PUBLICATIONS

Nauta, Bram. "A CMOS transconductance-C filter technique for very high frequencies." IEEE Journal of Solid-State Circuits27.2 (1992): 142-153. (Year: 1992).*

(Continued)

*Primary Examiner* — Ryan Johnson
(74) *Attorney, Agent, or Firm* — Patterson + Sheridan, LLP

(57) ABSTRACT

An example circuit includes: an inverter-based filter; a voltage regulator having an input and an output, the output of the voltage regulator providing a supply voltage to bias the inverter-based filter; a ring oscillator having a supply input and an output, the supply input of the ring oscillator coupled to the output of the voltage regulator; a control circuit coupled to the output of the ring oscillator and the input of the voltage regulator, the control circuit configured detect an oscillation frequency of the ring oscillator and to adjust the voltage regulator in response to the oscillator frequency.

20 Claims, 6 Drawing Sheets

(56) References Cited

OTHER PUBLICATIONS

Tah, Arya, and Debasish Kumar Rakshit. "Study of the frequency characteristics of a ring oscillator." International Journal of Computing and Network Technology 221.1251 (2013): 1-13. (Year: 2013).*
Boesch, R. et al., "A 0.003 mm2 5.2 mW/tap 20 GBd Inductor-less 5-Tap Analog RX-FFE," in Symp. VLSI Circuits Dig., Honolulu, HI, Jun. 2016, pp. 170-171.
Chen, S.W. et al., "Fully on-chip temperature, process, and voltage sensors," Proceedings of 2010 IEEE International Symposium on Circuits and Systems, Paris, 2010, pp. 897-900.
Jansen, R.J. E, et al., "Complementary constant-gm biasing of Nauta-transconductors in low-power gm-C filters to +/−2% accuracy over temperature," ESSCIRC (ESSCIRC), 2012 Proceedings of the, Bordeaux, 2012, pp. 466-469.

\* cited by examiner

US 10,469,090 B1

INVERTER-BASED FILTER BIASING WITH RING OSCILLATOR-BASED SUPPLY REGULATION

TECHNICAL FIELD

Examples of the present disclosure generally relate to electronic circuits and, in particular, to inverter-based filter biasing with ring oscillator-based supply regulation.

BACKGROUND

As process technology scales, inverter-based filters provide an advantage over filters implemented using conventional current-mode circuits due to higher speed and better power efficiency. Inverter-based filters have better gain matching properties, since the transconductance and the load track across process, voltage, and temperature (PVT) variations. The frequency response of an inverter-based filter is dependent on the capacitance and the transconductance (gm) in the circuit. The transconductance of an inverter is directly proportional to its supply voltage. In circuit implementations, transistor characteristics can vary greatly depending on PVT variations. Without efficient supply regulation, the transfer function of an inverter-based filter can vary beyond an acceptable range.

SUMMARY

Techniques for inverter-based filter biasing with ring oscillator-based supply regulation are described. In an example, a circuit includes: an inverter-based filter; a voltage regulator having an input and an output, the output of the voltage regulator providing a supply voltage to bias the inverter-based filter; a ring oscillator having a supply input and an output, the supply input of the ring oscillator coupled to the output of the voltage regulator; a control circuit coupled to the output of the ring oscillator and the input of the voltage regulator, the control circuit configured detect an oscillation frequency of the ring oscillator and to adjust the voltage regulator in response to the oscillator frequency.

In another example, an integrated circuit (IC) includes: a first circuit that includes an inverter-based filter; and a second circuit configured to bias the inverter-based filter. The second circuit includes: a voltage regulator having an input and an output, the output of the voltage regulator providing a supply voltage to bias the inverter-based filter; a ring oscillator having a supply input and an output, the supply input of the ring oscillator coupled to the output of the voltage regulator; a control circuit coupled to the output of the ring oscillator and the input of the voltage regulator, the control circuit configured detect an oscillation frequency of the ring oscillator and to adjust the voltage regulator in response to the oscillator frequency.

In another example, a method of biasing an inverter-based filter includes: providing a supply voltage to bias the inverter-based filter from a voltage regulator; controlling a ring oscillator using the supply voltage of the voltage regulator; detecting an oscillation frequency of the ring oscillator; and adjusting the voltage regulator in response to the oscillation frequency.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
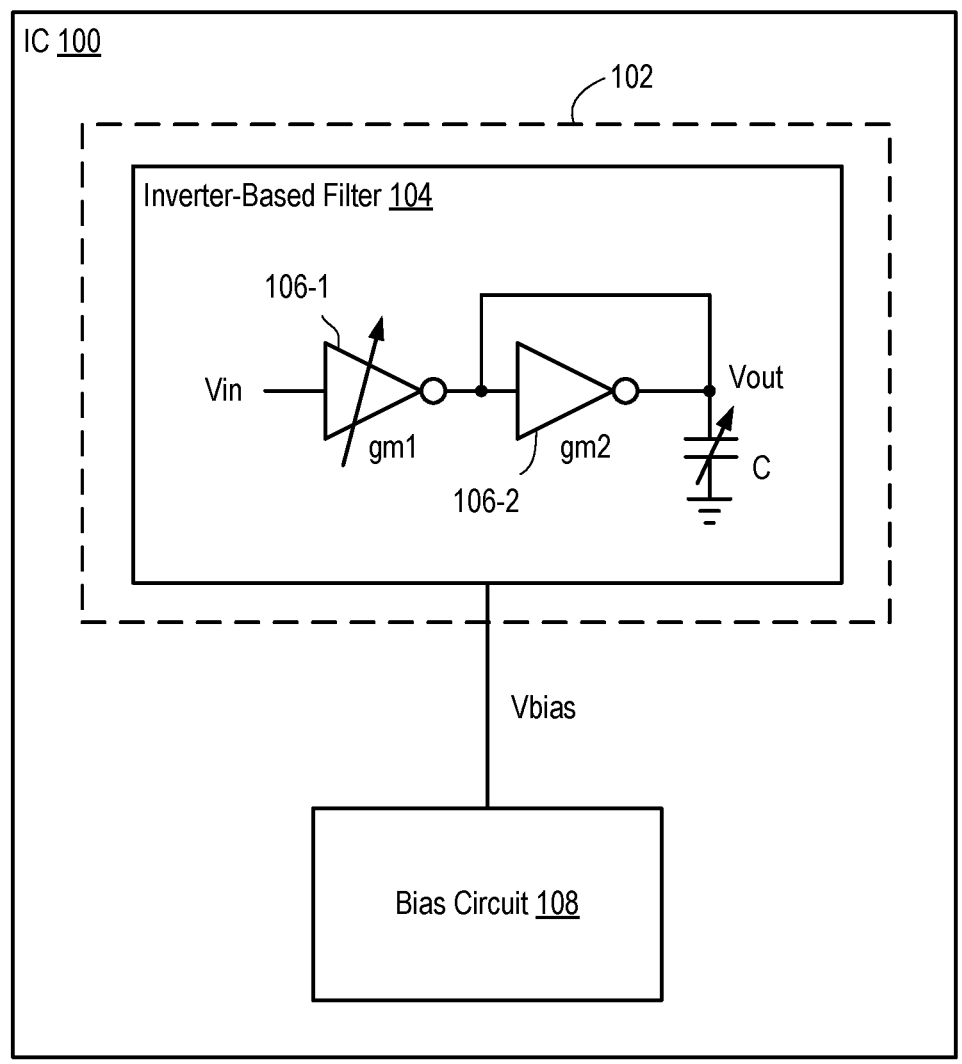
FIG. 1 is a block diagram depicting an integrated circuit (IC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for inverter-based filter biasing with ring oscillator-based supply regulation are described. In an example, an inverter-based filter, such as a low-pass filter, equalizer, or the like, includes a plurality of inverters. One or more of the inverters receive a bias voltage generated by a bias circuit. The bias circuit includes a voltage regulator that provides a bias voltage for biasing the inverter-based filter. The output of the voltage regulator is coupled to a ring oscillator. The oscillation frequency of the ring oscillator is controlled by the bias voltage. Thus, as the oscillation frequency of the ring oscillator changes with changes in the bias voltage. A control circuit compares the oscillation frequency of the ring oscillator with a reference to generate an error, which is used to control the voltage regulator. Supply regulation is important to ensure full functionality and good performance of an inverter-based filter across a wide range of operating conditions. The bias circuit described herein provides a stable bias voltage for inverter-based filters to achieve a desired and stable frequency response. The supply regulation is achieved using ring oscillator frequency detection and feedback, which provides for minimum power overhead and is less sensitive to local mismatches. These and other aspects are described below with respect to the drawings.

FIG. 1 is a block diagram depicting an integrated circuit (IC) 100 according to an example. The IC 100 includes a circuit 102 coupled to a bias circuit 108. The circuit 102 includes an inverter-based filter 104. While a single inverter-based filter 104 is shown in the example, it is to be understood that the circuit 102 can include a plurality of inverter-based filters 104. The circuit 102 can be any type of circuit that utilizes inverter-based filter(s), such as a low-pass filter, an equalizer (e.g., continuous time linear equalizer (CTLE), feed forward equalizer (FFE), etc.), or any other circuit that utilizes one or more filters. The bias circuit 108 is configured to provide a bias voltage for biasing the inverter-based filter 104.

In the example shown, the inverter-based filter 104 includes an inverter 106-1, an inverter 106-2, and a capacitor C, which are arranged to implement a low-pass filter. An input of the inverter 106-1 receives a voltage (Vin), and an output of the inverter 106-1 is coupled to an input of the inverter 106-2. An output of the inverter 106-2 provides an output voltage (Vout). The capacitor C is coupled between the output of the inverter 106-2 and electrical ground. The output of the inverter 106-2 is coupled to its input. The inverter 106-1 provides a transconductance gm1 and the inverter 106-2 provides a transconductance gm2. The transfer function of low pass filter is:

$$F(s) = \frac{gm1}{gm2} * \frac{1}{1 + s * \frac{C}{gm2}}, \qquad \text{Eq. 1}$$

where gm1 is the transconductance of the inverter 106-1, gm2 is the transconductance of the inverter 106-2, and C is the capacitance. An inverter's transconductance is a strong function of its supply voltage. Thus, without supply voltage regulation, the transfer function of an inverter-based filter can vary beyond an acceptable range. As described herein, the bias circuit 108 is configured to provide a regulated supply voltage for biasing inverter(s) in the inverter-based filter 104 so that the inverter-based filter 104 provides a stable frequency response (i.e., so that the transfer function does not vary beyond an acceptable range).

Figure 2:
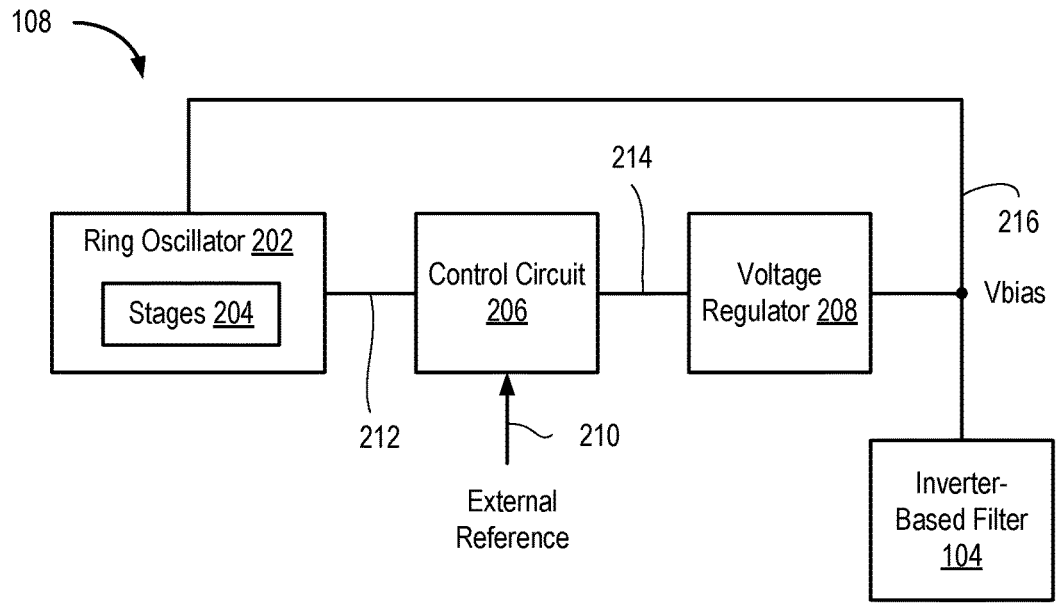
FIG. 2 is a block diagram depicting a bias circuit according to an example.

FIG. 2 is a block diagram depicting the bias circuit 108 according to an example. The bias circuit 108 includes a ring oscillator 202, a control circuit 206, and a voltage regulator 208. The voltage regulator 208 includes an input 214 and an output 216. The output of the voltage regulator 208 provides a supply voltage (Vbias) for biasing inverters in the inverter-based filter 104. In an example, the voltage regulator 208 is a low-dropout (LDO) voltage regulator, although other types of voltage regulators can be used. In general, any voltage regulator that functions as described herein can be used in the bias circuit 108.

An input of the ring oscillator 202 is coupled to the output 216 of the voltage regulator 208. The input of the ring oscillator 202 is a supply input for receiving a supply voltage and thus the input is also referred to as a "supply input." An output 212 of the ring oscillator 202 is coupled to an input of the control circuit 206. The output 212 of the ring oscillator 202 provides an oscillating voltage dependent on the supply voltage at the input. An output of the control circuit 206 is coupled to the input 214 of the voltage regulator 208. Another input 210 of the control circuit 206 receives an external reference signal, as described further herein.

In operation, the voltage Vbias applied to the input of the ring oscillator 202 controls the oscillation frequency of the voltage at the output 212 of the ring oscillator 202. The ring oscillator 202 includes a plurality of stages 204. Any variation in Vbias also varies the oscillation frequency of the ring oscillator 202. The control circuit 206 monitors the output 212 of the ring oscillator 202. The control circuit 206 determines the oscillation frequency of the ring oscillator 202. The control circuit 206 generates a control signal for controlling the voltage regulator 208 via the input 214 based on the determined oscillation frequency and the external reference signal.

The ring oscillator 202 consumes substantially constant power regardless of the number of the stages 204. The power consumed by the ring oscillator 202 is defined by $N*Cgate*Vbias^2*f_{osc}$, where N is the number of stages 204, Cgate is gate capacitance of each stage 204, Vbias is the supply voltage, and $f_{osc}$ is the oscillation frequency. The oscillation frequency of the ring oscillator 202 is determined by 1/(2*N*Tgate), where Tgate is the gate delay of each stage 204. Therefore, the power consumed by the ring oscillator 202 is only determined by $(Cgate*Vbias^2)/(2*Tgate)$. Stated differently, the variation in the oscillation period is inversely proportional to the square root of the number of stages 204. By increasing N, both the oscillation frequency and its variation decrease. The control circuit 206 measures the oscillation frequency of the ring oscillator 202 and uses the measured oscillation frequency as a reference to tune the voltage regulator 208. By using the ring oscillator, the supply voltage Vbias is properly regulated with low power consumption, low area, and low variation overhead.

Figure 3:
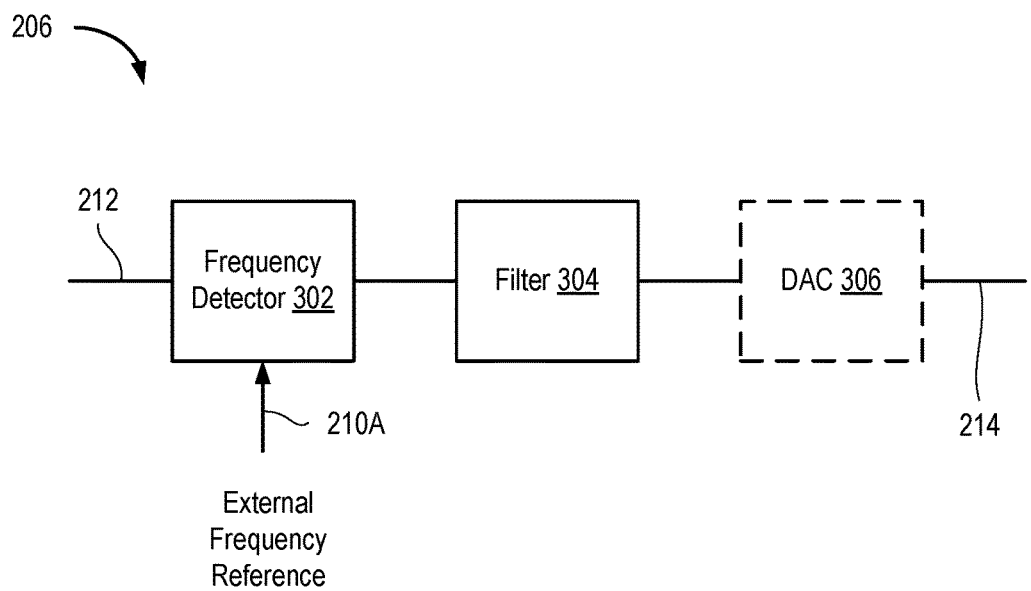
FIG. 3 is a block diagram depicting a control circuit according to an example.

FIG. 3 is a block diagram depicting the control circuit 206 according to an example. The control circuit 206 includes a frequency detector 302 and a filter 304. An input of the frequency detector 302 is coupled to the output 212 of the ring oscillator 202. Another input 210A of the frequency detector 302 receives an external frequency reference. An output of the frequency detector 302 is coupled to an input of the filter 304. An output of the filter 304 can be coupled directly to the input 214 of the voltage regulator 208.

In operation, the frequency detector 302 compares the oscillation frequency of the ring oscillator 202 with the external frequency reference to determine a frequency error signal. The filter 304 integrates and filters the error signal and provides a control signal to the input 214 of the voltage regulator 208. In an example, the input 214 is a digital input and the filter 304 provides a digital signal to the input 214 to control the voltage regulator 208. In another example, the input 214 of the voltage regulator 208 is an analog input. In such case, the control circuit 206 can include a digital-to-analog converter (DAC) 306 for converting the output of the filter 304 to an analog control signal to be applied to the voltage regulator 208. Alternatively, the DAC 306 can be incorporated in the voltage regulator 208.

Figure 4:
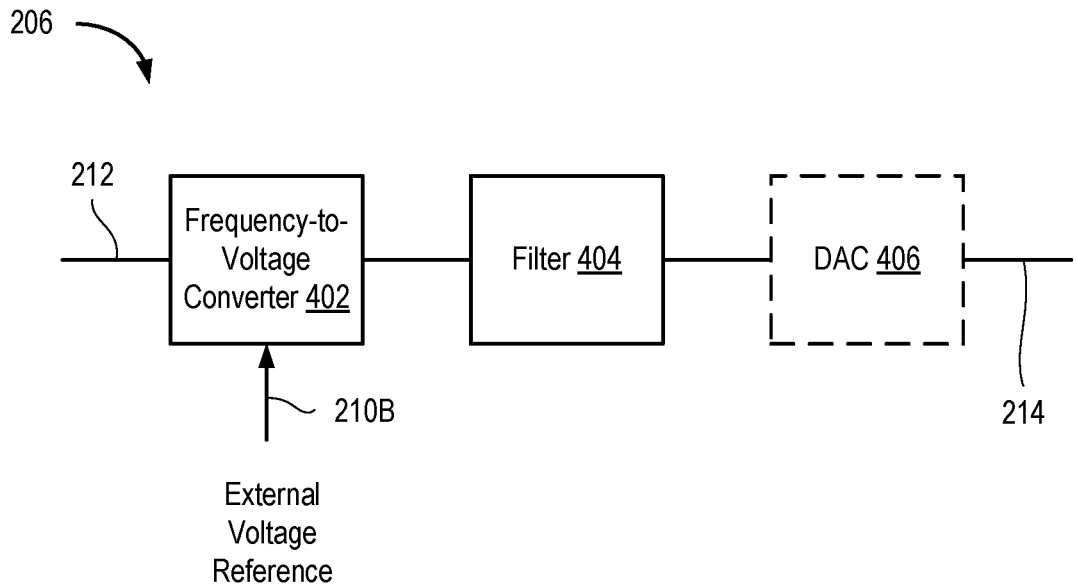
FIG. 4 is a block diagram depicting a control circuit according to another example.

FIG. 4 is a block diagram depicting the control circuit 206 according to another example. In this example, the control circuit 206 includes a frequency-to-voltage converter 402 and a filter 404. An input of the frequency-to-voltage converter 402 is coupled to the output 212 of the ring oscillator 202. Another input 210B of the frequency-to-voltage converter 402 receives an external voltage reference. An output of the frequency-to-voltage converter 402 is coupled to an input of the filter 404. An output of the filter 404 can be coupled directly to the input 214 of the voltage regulator 208.

In operation, the frequency-to-voltage converter 402 coverts the oscillation frequency of the ring oscillator 202 to a voltage and compares the voltage with the external voltage reference to determine an error signal. The filter 404 integrates and filters the error signal and provides a control signal to the input 214 of the voltage regulator 208. In an example, the input 214 is a digital input and the filter 304 provides a digital signal to the input 214 to control the voltage regulator 208. In another example, the input 214 of the voltage regulator 208 is an analog input. In such case, the control circuit 206 can include a DAC 406 for converting the output of the filter 404 to an analog control signal to be applied to the voltage regulator 208. Alternatively, the DAC 406 can be incorporated in the voltage regulator 208.

Figure 5:
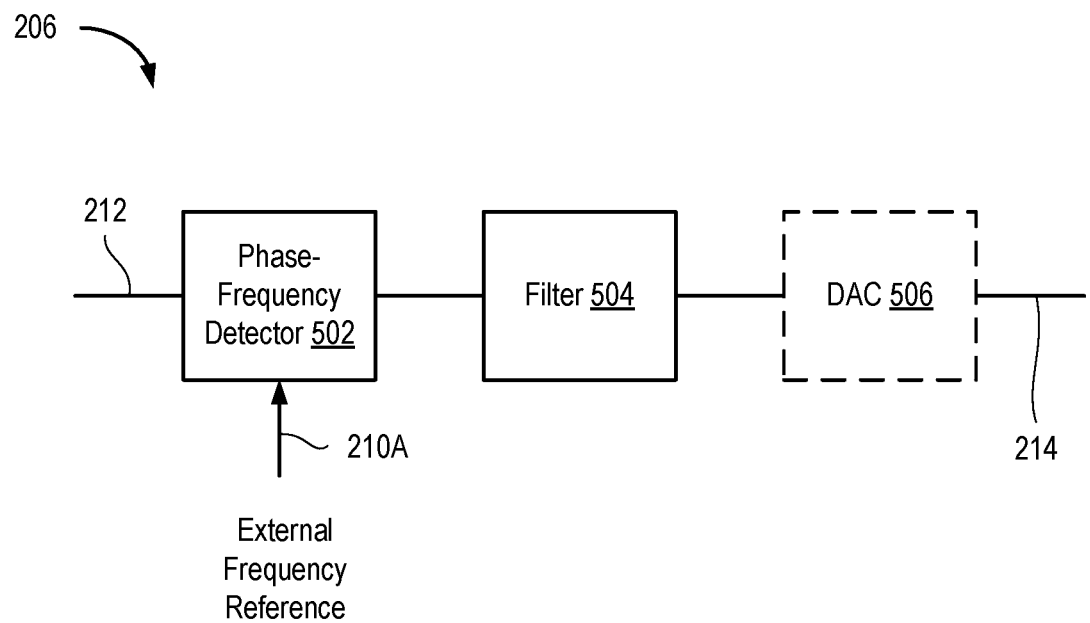
FIG. 5 is a block diagram depicting a control circuit according to yet another example.

FIG. 5 is a block diagram depicting the control circuit 206 according to yet another example. The control circuit 206 includes a phase-frequency detector (PFD) 502 and a filter 504. An input of the PFD 502 is coupled to the output 212 of the ring oscillator 202. Another input 210A of the PFD 502 receives an external frequency reference. An output of the PFD 502 is coupled to an input of the filter 504. An output of the filter 504 can be coupled directly to the input 214 of the voltage regulator 208.

In operation, the PFD 502 performs phase and frequency detection based on the oscillation frequency of the ring oscillator 202 and the external frequency reference to generate an error signal. The filter 504 integrates and filters the error signal and provides a control signal to the input 214 of the voltage regulator 208. In an example, the input 214 is a digital input and the filter 504 provides a digital signal to the input 214 to control the voltage regulator 208. In another example, the input 214 of the voltage regulator 208 is an analog input. In such case, the control circuit 206 can include a DAC 506 for converting the output of the filter 504 to an analog control signal to be applied to the voltage regulator 208. Alternatively, the DAC 506 can be incorporated in the voltage regulator 208.

Thus, the control circuit 206 can use a frequency detector or a full PFD to generate an error signal based on an external frequency reference. If an external frequency reference is not available, then the control circuit 206 can be implemented using a frequency-to-voltage converter and can generate the error signal based on an external voltage reference or internal reference voltage (e.g., a bandgap reference). The control circuit 206 can output a digital or analog control signal depending on the input 214 of the voltage regulator 208.

Figure 6:
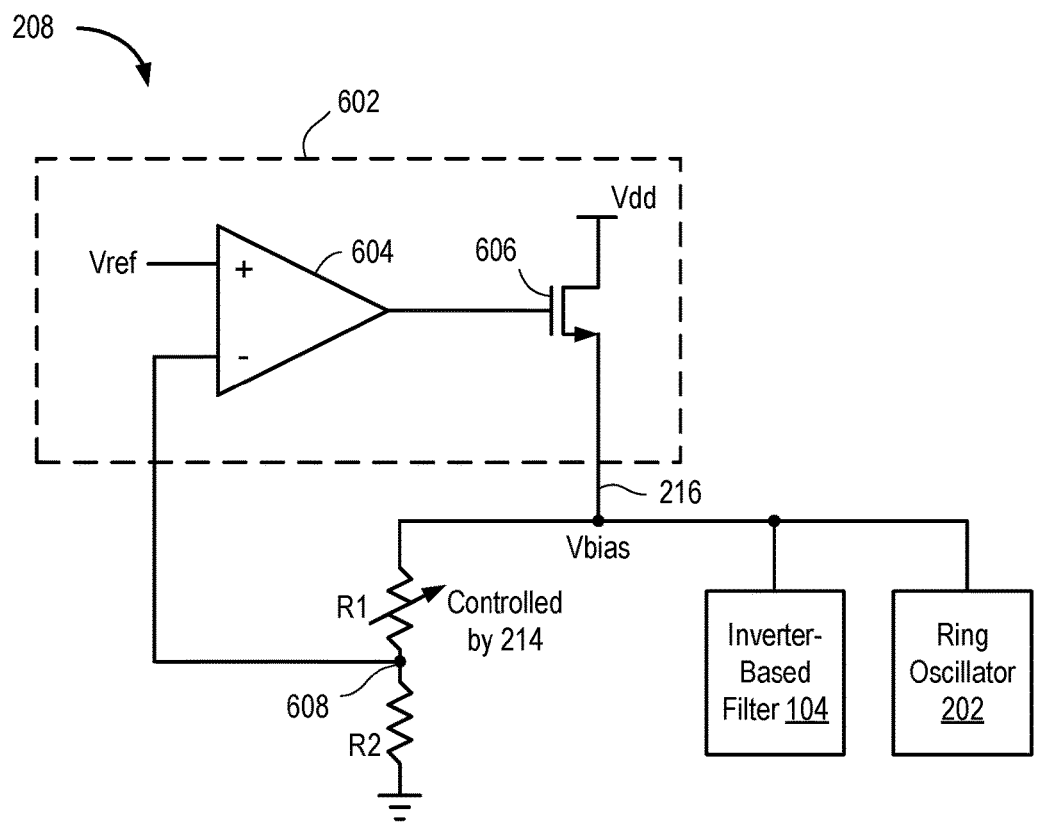
FIG. 6 is a block diagram depicting a voltage regulator according to an example.

FIG. 6 is a block diagram depicting the voltage regulator 208 according to an example. In the example, the voltage regulator 208 includes an amplifier 602 and a pair of resistors R1 and R2. The amplifier 602 includes an operational amplifier 604 and an output transistor 606. A non-inverting input of the operational amplifier 604 receives a reference voltage. A non-inverting input of the operational amplifier 604 is coupled to a node 608. An output of the operational amplifier 604 is coupled to a gate of the output transistor 606. In the example, the output transistor 606 comprises an N-channel field effect transistor (FET), such as an N-type metal oxide semiconductor FET (N-type MOSFET or NMOS). A source of the output transistor 607 is coupled to a supply voltage Vdd. A drain of the output transistor 606 is coupled to the output 216 of the voltage regulator 208. The resistor R1 is coupled between the output 216 and the node 608. The resistor R2 is coupled between the node 608 and electrical ground. The resistor R1 is digitally controlled through the input 214 of the voltage regulator 208.

In operation, the control circuit 206 generates a digital control signal as described in various examples above. The digital control signal controls the value of the resistor R1. The resistors R1 and R2 form a voltage divider. The voltage at the node 608 thus varies with changes to the resistor R1. This in turn causes changes in the output voltage of the operational amplifier 604, which causes change sin Vbias. In this manner, the voltage regulator 208 provides a regulated Vbias as output for use by the inverter-based filter 104. The voltage Vbias also controls the oscillation frequency of the ring oscillator 202, which is used to provide feedback and generate the digital signal for controlling the value of the resistor R1.

It is to be understood that the amplifier 602 can have other structures than that shown in the example. In general, the amplifier 602 includes an input for receiving a reference voltage, another input for receiving a control voltage, and an output that provides a regulated supply voltage (e.g., Vbias).

Figure 7:
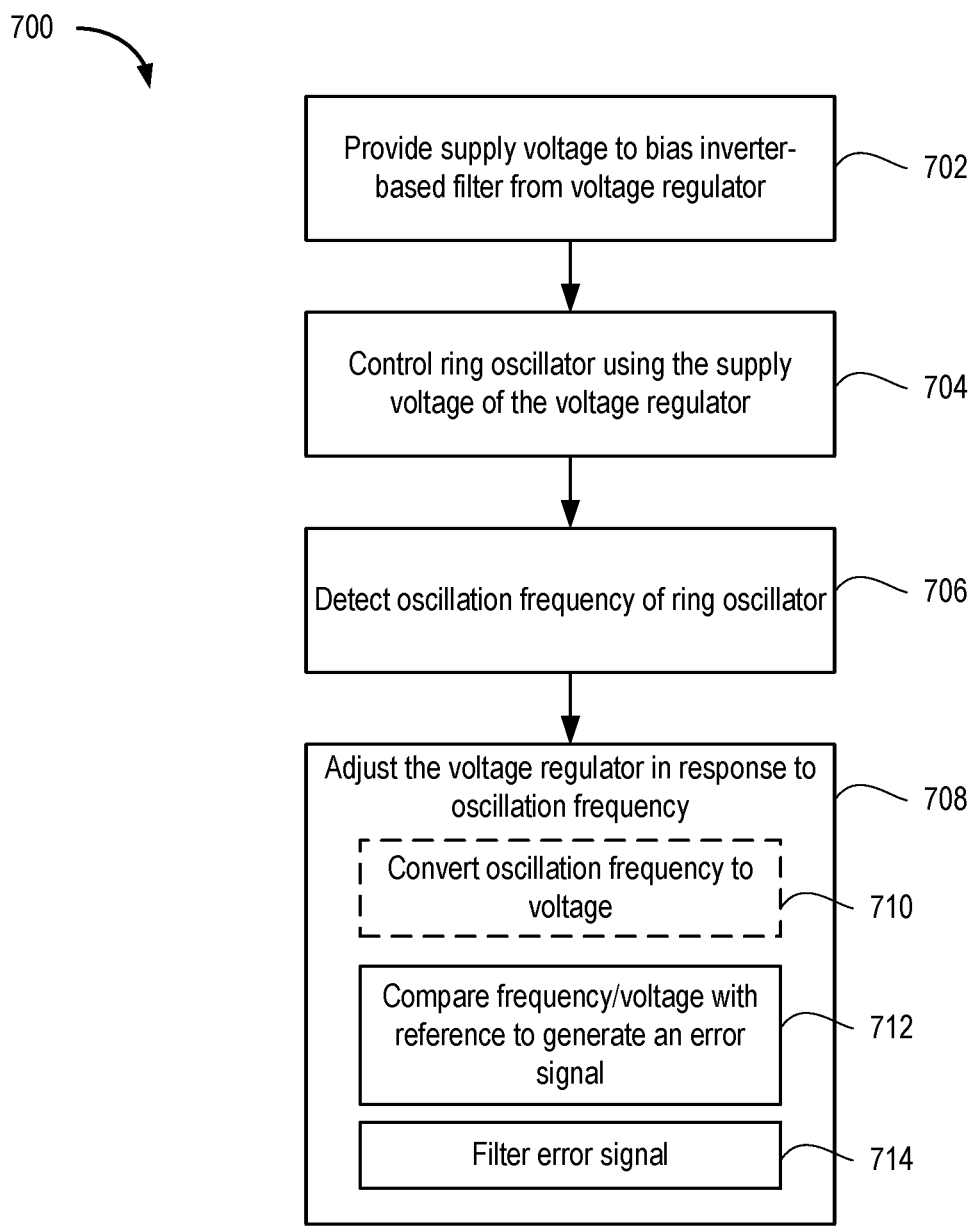
FIG. 7 is a flow diagram depicting a method of biasing an inverter-based filter according to an example.

FIG. 7 is a flow diagram depicting a method 700 of biasing an inverter-based filter according to an example. The method 700 begins at step 702, where the voltage regulator 208 provides a supply voltage to bias the inverter-based filter 104. At step 704, the supply voltage controls the oscillation frequency of the ring oscillator 202. At step 706, the control circuit 206 detects the oscillation frequency of the ring oscillator 202. At step 708, the control circuit 206 adjusts the voltage regulator in response to the oscillation frequency. For example, at step 712, the control circuit 206 can compare the frequency with a reference frequency to generate an error signal. The control circuit 206 can use a frequency detector or a PFD to perform the comparison. In another example, the control circuit 206 can first convert the oscillation frequency to a voltage (step 710). Then, at step 712, the control circuit 206 can compare the voltage with a reference voltage to generate the error signal. At step 714, the control circuit 206 can filter the error signal.

Figure 8:
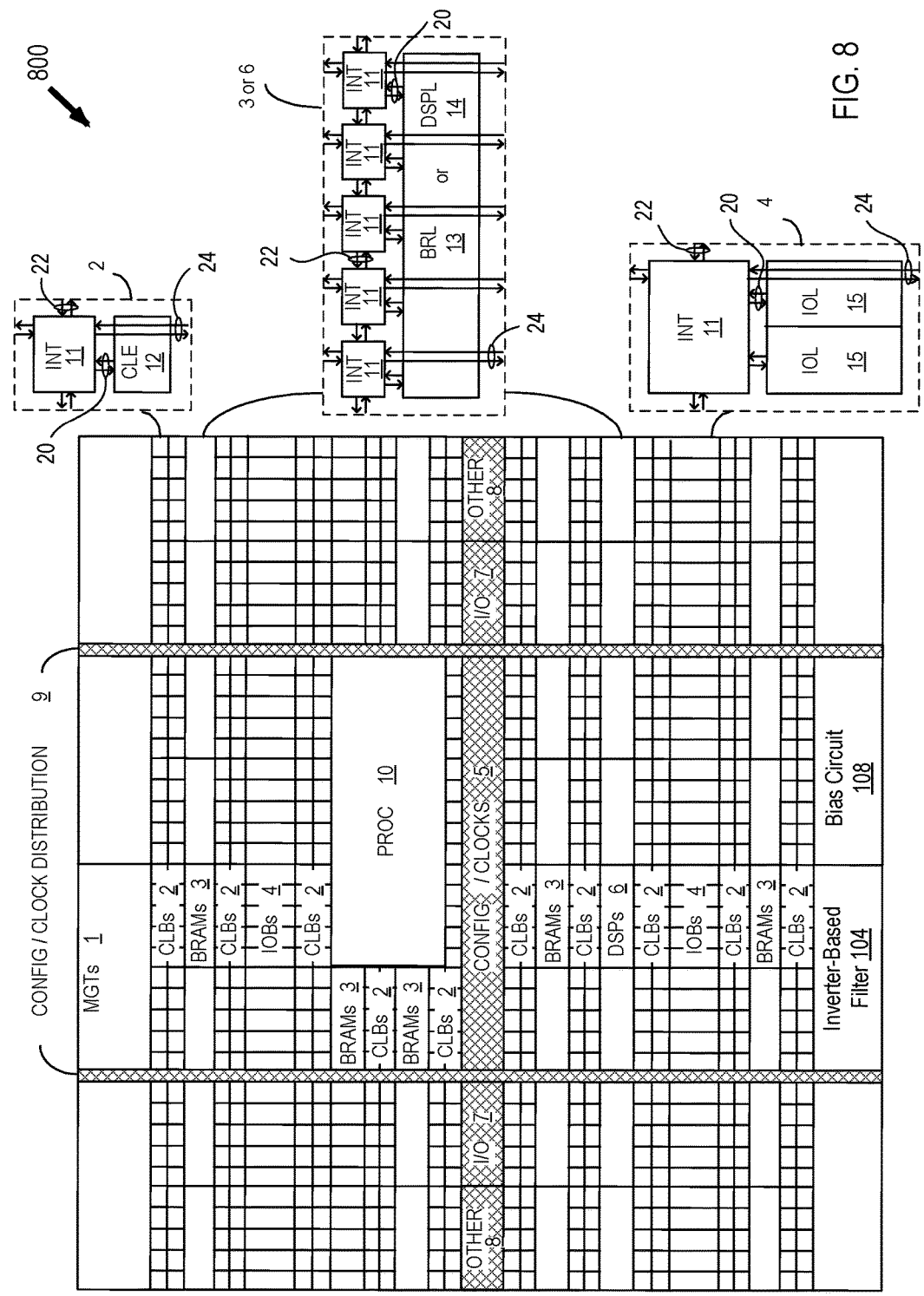
FIG. 8 illustrates an architecture of a field programmable gate array (FPGA) in which techniques described herein can be used.

The inverter-based filter 104 and the bias circuit 108 described above can be implemented in an IC, such as a programmable IC. FIG. 8 illustrates an architecture of FPGA 800 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 800 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 8. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 6) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A circuit, comprising:
   an inverter-based filter;
   a voltage regulator having an input and an output, the output of the voltage regulator providing a supply voltage to bias the inverter-based filter, the voltage regulator including:
      an amplifier having a first input receiving a reference voltage, a second input coupled to a node, and an output providing a voltage to the inverter-based filter and the input of the ring oscillator
      a tuned resistor coupled between the output of the amplifier and the node; and
      a resistor coupled between the node and an electrical ground;
   a ring oscillator having a plurality of stages, a supply input, and an output, the supply input of the ring oscillator coupled to the output of the voltage regulator, wherein a variation in an oscillation period of the ring oscillator is inversely proportional to the square root of a number of the plurality of stages;
   a control circuit coupled to the output of the ring oscillator and the input of the voltage regulator, the control circuit configured detect an oscillation frequency of the ring oscillator and to adjust the voltage regulator in response to the oscillator frequency.

2. The circuit of claim 1, wherein the control circuit comprises:
   a frequency detector having a first input coupled to the output of the ring oscillator, a second input receiving a frequency reference, and an output; and
   a filter having an input coupled to the output of the frequency detector and an output coupled to the input of the voltage regulator.

3. The circuit of claim 1, wherein the control circuit comprises:
   a frequency-to-voltage converter having a first input coupled to the output of the ring oscillator, a second input receiving a voltage reference, and an output; and
   a filter having an input coupled to the output of the frequency-to-voltage converter and an output coupled to the input of the voltage regulator.

4. The circuit of claim 1, wherein the control circuit comprises:
   a phase-frequency detector (PFD) having a first input coupled to the output of the ring oscillator, a second input receiving a frequency reference, and an output; and
   a filter having an input coupled to the output of the frequency detector and an output coupled to the input of the voltage regulator.

5. The circuit of claim 1, wherein the input of the voltage regulator is a digital input, and wherein the control circuit outputs a digital signal to adjust the voltage regulator in response to the oscillator frequency.

6. The circuit of claim 5, wherein the tuned resistor comprises a digitally-tuned resistor.

7. The circuit of claim 1, wherein the input of the voltage regulator is an analog input, and wherein the control circuit includes a digital-to-analog converter (DAC) to convert a digital signal to an analog signal to adjust the voltage regulator in response to the oscillator frequency.

8. An integrated circuit (IC), comprising:
   a first circuit that includes an inverter-based filter; and
   a second circuit configured to bias the inverter-based filter, the second circuit including:
      a voltage regulator having an input and an output, the output of the voltage regulator providing a supply voltage to bias the inverter-based filter, the voltage regulator including:
         an amplifier having a first input receiving a reference voltage, a second input coupled to a node, and an output providing a voltage to the inverter-based filter and the input of the ring oscillator
         a tuned resistor coupled between the output of the amplifier and the node; and a resistor coupled between the node and an electrical ground;

a ring oscillator having a plurality of stages, a supply input, and an output, the supply input of the ring oscillator coupled to the output of the voltage regulator, wherein a variation in an oscillation period of the ring oscillator is inversely proportional to the square root of a number of the plurality of stages;

a control circuit coupled to the output of the ring oscillator and the input of the voltage regulator, the control circuit configured detect an oscillation frequency of the ring oscillator and to adjust the voltage regulator in response to the oscillator frequency.

9. The IC of claim 8, wherein the control circuit comprises:

a frequency detector having a first input coupled to the output of the ring oscillator, a second input receiving a frequency reference, and an output; and a filter having an input coupled to the output of the frequency detector and an output coupled to the input of the voltage regulator.

10. The IC of claim 8, wherein the control circuit comprises:

a frequency-to-voltage converter having a first input coupled to the output of the ring oscillator, a second input receiving a voltage reference, and an output; and a filter having an input coupled to the output of the frequency-to-voltage converter and an output coupled to the input of the voltage regulator.

11. The IC of claim 8, wherein the control circuit comprises:

a phase-frequency detector (PFD) having a first input coupled to the output of the ring oscillator, a second input receiving a frequency reference, and an output; and a filter having an input coupled to the output of the frequency detector and an output coupled to the input of the voltage regulator.

12. The IC of claim 8, wherein the input of the voltage regulator is a digital input, and wherein the control circuit outputs a digital signal to adjust the voltage regulator in response to the oscillator frequency.

13. The IC of claim 12, wherein the tuned resistor comprises a digitally-tuned resistor.

14. The IC of claim 8, wherein the input of the voltage regulator is an analog input, and wherein the control circuit includes a digital-to-analog converter (DAC) to convert a digital signal to an analog signal to adjust the voltage regulator in response to the oscillator frequency.

15. The IC of claim 8, wherein the first circuit comprises a low-pass filter or an equalizer.

16. A method of biasing an inverter-based filter, comprising:

providing a supply voltage to bias the inverter-based filter from a voltage regulator, the voltage regulator including:

an amplifier having a first input receiving a reference voltage, a second input coupled to a node, and an output providing a voltage to the inverter-based filter and the input of the ring oscillator a tuned resistor coupled between the output of the amplifier and the node; and a resistor coupled between the node and an electrical ground;

controlling a ring oscillator using the supply voltage of the voltage regulator, the ring oscillator having a plurality of stages, wherein a variation in an oscillation period of the ring oscillator is inversely proportional to the square root of a number of the plurality of stages;

detecting an oscillation frequency of the ring oscillator; and adjusting the voltage regulator in response to the oscillation frequency.

17. The method of claim 16, wherein the step of adjusting the voltage regulator comprises:

comparing the oscillation frequency with a frequency reference to generate a frequency error; and filtering the frequency error to control the voltage regulator.

18. The method of claim 16, wherein the step of adjusting the voltage regulator comprises:

converting the oscillation frequency to a voltage;

comparing the voltage to a voltage reference to generate an error; and filtering the error to control the voltage regulator.

19. The method of claim 16, wherein the step of adjusting the voltage regulator comprises generating a digital signal in response to the oscillator frequency to control a digital input of the voltage regulator.

20. The method of claim 16, wherein the step of adjusting the voltage regulator comprises generating an analog signal in response to the oscillator frequency to control an analog input of the voltage regulator.

* * * * *